(12) United States Patent
Saitou (10) Patent No.: US 11,462,873 B2
(45) Date of Patent: Oct. 4, 2022

(54) CONTACT-TYPE POWER SUPPLY APPARATUS AND CONTACT UNIT

(71) Applicant: ULVAC, INC., Chigasaki (JP)

(72) Inventor: Shuuji Saitou, Chigasaki (JP)

(73) Assignee: Ulvac, Inc., Chigasaki (JP)

( * ) Notice: Subject to any disclaimer, the term of this patent is extended or adjusted under 35 U.S.C. 154(b) by 0 days.

(21) Appl. No.: 17/233,969

(22) Filed: Apr. 19, 2021

(65) Prior Publication Data

US 2021/0242647 A1    Aug. 5, 2021

Related U.S. Application Data

(63) Continuation of application No. PCT/JP2019/020987, filed on May 28, 2019.

(30) Foreign Application Priority Data

Oct. 17, 2018   (JP) ............................. JP2018-195559

(51) Int. Cl.
*H01R 39/64* (2006.01)
*C23C 14/34* (2006.01)
*H01R 39/26* (2006.01)

(52) U.S. Cl.
CPC ......... *H01R 39/64* (2013.01); *C23C 14/3407* (2013.01); *H01R 39/26* (2013.01)

(58) Field of Classification Search
CPC ........ H01R 39/64; H01R 39/18; H01R 39/26; H01R 39/27; C23C 14/3407
See application file for complete search history.

(56) References Cited

U.S. PATENT DOCUMENTS 8,918,008 B2 * 12/2014 Okamoto ............... H01R 39/64
                                                                399/90
9,929,526 B2    3/2018 Saitou
(Continued)

FOREIGN PATENT DOCUMENTS

CN    203242896 U    10/2013
CN    203443286 U    2/2014
(Continued)

OTHER PUBLICATIONS

International Search Report dated Jul. 23, 2019 in International Application No. PCT/JP2019/020987.
(Continued)

*Primary Examiner* — Oscar C Jimenez
*Assistant Examiner* — Paul D Baillargeon
(74) *Attorney, Agent, or Firm* — Saliwanchik, Lloyd & Eisenschenk (57) ABSTRACT

A contact-type power supply apparatus includes: a first cylindrical body; a second cylindrical body configured to surround the first cylindrical body, be disposed concentrically to the first cylindrical body, and be rotatable around a central axis of the first cylindrical body; an annular body configured to surround the first cylindrical body, be disposed concentrically to the first cylindrical body, be in non-contact with the second cylindrical body, and have an end surface being an inclined surface having a tapered shape; and a contact body configured to face the annular body in an axial direction of the first cylindrical body, be electrically connected to the second cylindrical body, rotate around the central axis around the first cylindrical body together with the second cylindrical body, have a contact surface that is in contactable with the inclined surface, and receive an electric potential of the annular body by sliding with the annular body.

9 Claims, 5 Drawing Sheets

(56) References Cited

U.S. PATENT DOCUMENTS

| | | |
|---|---|---|
| 2003/0173217 A1 | 9/2003 | Crowley |
| 2010/0243428 A1 | 9/2010 | Crowley |
| 2018/0048104 A1 | 2/2018 | Saitou |

FOREIGN PATENT DOCUMENTS

| | | |
|---|---|---|
| CN | 206046408 U | 3/2017 |
| CN | 107210571 A | 9/2017 |
| JP | 9-283250 A | 10/1997 |
| JP | 3974541 B2 | 6/2007 |
| JP | 6168716 B2 | 7/2017 |
| WO | WO-2016/132663 A1 | 8/2016 |
| WO | WO-2016/185714 A1 | 11/2016 |

OTHER PUBLICATIONS

Office Action dated Oct. 7, 2019 in Japanese Application No. 2019-541204, along with its English translation.
Office Action dated Aug. 28, 2020 in Chinese Application No. 201980005843.1, along with its English translation.

* cited by examiner

CONTACT-TYPE POWER SUPPLY APPARATUS AND CONTACT UNIT

CROSS REFERENCE TO RELATED APPLICATIONS

This application is a continuation of International Patent Application No. PCT/JP2019/020987, filed May 28, 2019; which claims priority to Japanese Application No. 2018-195559, filed Oct. 17, 2018; which are hereby incorporated by reference in their entirety.

BACKGROUND

A contact-type power supply apparatus is used to, for example, power a target of a rotation cathode unit in a sputtering apparatus. Such a power supply apparatus includes a conductive inner cylindrical body, a conductive outer cylindrical body disposed concentrically around the inner cylindrical body, a driving means for rotatably driving the outer cylindrical body, and a brush that conducts the inner cylindrical body and the outer cylindrical body while sliding the inner peripheral surface of the outer cylindrical body on the outer peripheral surface of the inner cylindrical body.

However, the brush wears with the sliding of the brush. As a result, the contact area between the outer cylindrical body and the brush is reduced, the conduction between the cylindrical bodies is insufficient in some cases when operating the contact-type power supply apparatus for a long time. In such a situation, a contact-type power supply apparatus in which the brush and the outer cylindrical body are in contact with each other at all times and a current can be caused to flow between the cylindrical bodies over a long period of time even if the brush is worn is provided.

SUMMARY

However, in a configuration in which the brush is interposed between the inner cylinder and the outer cylinder and the inner cylinder and the outer cylinder are constantly conducted, the structure of the brush is complicated in order to improve the contact property of the brush. In the case of interposing the brush having such a complicated structure between the inner cylindrical body and the outer cylindrical body, the axis alignment with respect to the inner cylindrical body and the outer cylindrical body of the brush becomes difficult, and there is a possibility that the contact property with respect to the cylindrical body of the brush becomes unstable. In particular, in the brush of the above disclosed example, three or more sliding surfaces are necessary in order to form the electric path passing through the brush, and the contact property on each of the sliding surfaces needs to be ensured.

In view of the above circumstances, it is desired to provide a contact-type power supply apparatus capable of stably causing a current to flow between cylindrical bodies for a long time with a simpler structure, and a contact unit disposed in the contact-type power supply device.

According to an embodiment of the present disclosure, there is provided a contact-type power supply apparatus, including: a first cylindrical body; a second cylindrical body configured to surround the first cylindrical body, to be disposed concentrically to the first cylindrical body, and to be rotatable around a central axis of the first cylindrical body; an annular body configured to surround the first cylindrical body, to be disposed concentrically to the first cylindrical body, to be in non-contact with the second cylindrical body, and to have an end surface being an inclined surface having a tapered shape; and a contact body configured to face the annular body in an axial direction of the first cylindrical body, to be electrically connected to the second cylindrical body, to rotate around the central axis around the first cylindrical body together with the second cylindrical body, to have a contact surface that is in contactable with the inclined surface, and to being capable of receiving an electric potential of the annular body by sliding with the annular body.

With such a contact-type power supply apparatus, it is a possible to stably cause a current to flow between cylindrical bodies for a long time with a simpler structure.

In the contact-type power supply apparatus, the contact body may be configured to be pressed against the second cylindrical body when the contact body is pressed against the inclined surface of the annular body.

With such a contact-type power supply apparatus, since the contact body is pressed against the second cylindrical body when the contact body is pressed against the inclined surface of the annular body, the contact body is surely in contact with the second cylindrical body.

The contact-type power supply apparatus may further include an annular support that is fixed to the second cylindrical body, surrounds the first cylindrical body, and supports the contact body. The support may be configured to rotate around the central axis together with the second cylindrical body and the contact body. A relative distance between the support and the contact body in the axial direction may be independently variable.

With such a contact-type power supply apparatus, the contact boy is stably supported by the support, and the relative distance between the support and the contact body in the axial direction is variable.

In the contact-type power supply apparatus, the contact body may be divided into at least two parts in a direction in which the second cylindrical body rotates. The relative distance of each of the at least two parts may be variable.

With such a contact-type power supply apparatus, the relative distance between each of the at least two parts and the support is independently variable. As a result, the at least two parts are evenly in contact with the annular body.

In the contact-type power supply apparatus, the second cylindrical body may be surrounded by the annular body. The contact body may face the annular body in a direction of the central axis.

With such a contact-type power supply apparatus, the first cylindrical body and the second cylindrical body are conducted by the contact between the contact body and the annular body.

In the contact-type power supply apparatus, the contact body may be configured to include a guide pin that protrudes toward the support. The guide pin may be configured to be inserted into and supported by the support. The guide pin may be configured to be slidable in the axial direction with respect to the support.

With such a contact-type power supply apparatus, the contact body is stably supported by the guide pin.

In the contact-type power supply apparatus, an elastic member may be disposed around the guide pin. The contact body may be in contact with the annular body by a repulsive force of the elastic member between the contact body and the support.

With such a contact-type power supply apparatus, the contact body can be in contact with the annular body by a repulsive force of the elastic member between the contact body and the support.

In the contact-type power supply apparatus, a gap may be provided between the guide pin and the support.

With such a contact-type power supply apparatus, the at least two parts and the support are stably in contact with each other.

According to an embodiment of the present disclosure, there is provided a contact unit applied to a contact-type power supply apparatus including a first cylindrical body and a second cylindrical body configured to surround the first cylindrical body, to be disposed concentrically to the first cylindrical body, and to be rotatable around a central axis of the first cylindrical body. The contact unit includes: a contact body configured to face an annular body in an axial direction of the first cylindrical body, to surround the first cylindrical body, to be disposed concentrically to the first cylindrical body, to have a contact surface that is in contactable with the inclined surface, and to being capable of receiving an electric potential of the annular body by sliding with the annular body, and the annular body being configured to be in non-contact with the second cylindrical body, and to have an end surface being an inclined surface having a tapered shape; and an annular support that is fixed to the second cylindrical body, being capable of surrounding the first cylindrical body, and supporting the contact body, a relative distance between the support and the contact body in the axial direction being variable.

With such a contact unit, it is possible to stably cause a current to flow between cylindrical bodies in a contact-type power supply apparatus for a long time with a simpler structure.

DETAILED DESCRIPTION OF EMBODIMENTS

Hereinafter, an embodiment of the present disclosure will be described with reference to the drawings. In each drawing, XYZ axis coordinates are introduced in some cases. For example, the axial direction of a cylindrical body in this embodiment is the Y-axis direction, the up-and-down direction of a contact-type power supply apparatus perpendicular to the Y-axis direction is the Z-axis direction, and the direction perpendicular to the Y-axis and the Z-axis is the X-axis direction. Further, the same members or members having the same function are denoted by the same reference symbols, and description of the members is appropriately omitted after the description of the members.

Figure 1:
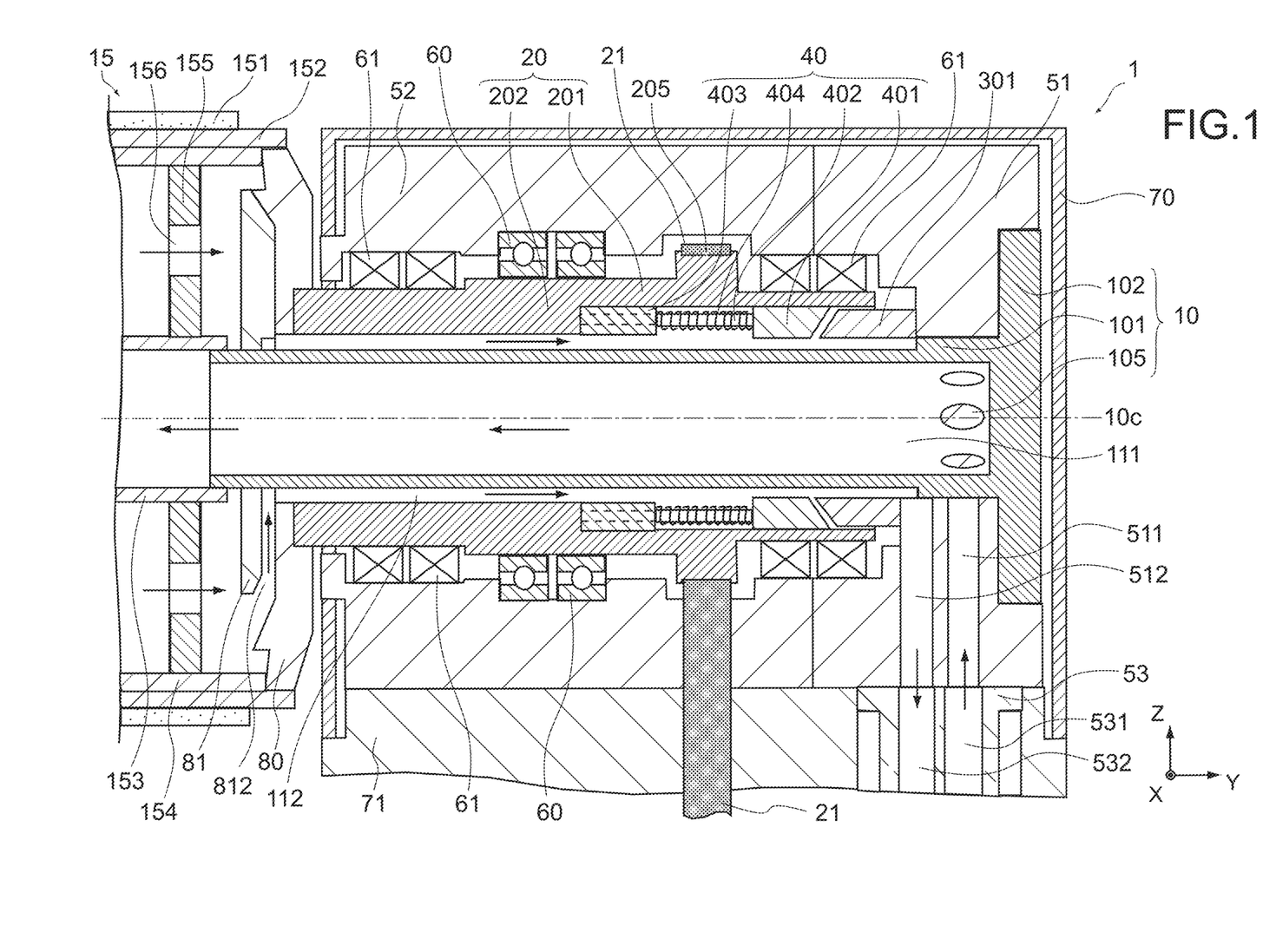
FIG. 1 is a schematic cross-sectional view showing an example of a contact-type power supply apparatus according to this embodiment.

FIG. 1 is a schematic cross-sectional view showing an example of a contact-type power supply apparatus according to this embodiment.

A contact-type power supply apparatus 1 includes an inner cylindrical body 10 (first cylindrical body), an outer cylindrical body 20 (second cylindrical body), an annular body 301, a contact unit 40, a housing 51 (first housing), a housing 52 (second housing), a bearing member 60, an oil seal 61, a cooling tube 53, and a housing case 70. Further, the contact-type power supply apparatus 1 may include a flange 80 and a guide plate 81.

The contact-type power supply apparatus 1 is used as, for example, a power supply apparatus that powers a rotation sputtering target. The application of the contact-type power supply apparatus 1 is not limited to the sputtering apparatus. The sputtering target is also a cathode of the sputtering apparatus.

The respective members of the contact-type power supply apparatus 1 will be described.

The inner cylindrical body 10 is a conductive cylindrical body located near the center of the contact-type power supply apparatus 1. The inner cylindrical body 10 includes a cylindrical body portion 101 extending in the axial direction of the inner cylindrical body 10 (hereinafter, the Y-axis direction), the cylindrical body portion 101, and a flange portion 102 that is concentrically connected to the cylindrical body portion 101. The cylindrical body portion 101 has an annular shape in the cut surface of the X-Z axis plane. The flange portion 102 is connected to the end of the cylindrical body portion 101. As a result, one end of the inner cylindrical body 10 is closed by the flange portion 102.

A plurality of openings 105 is provided in the cylindrical body portion 101 in the vicinity of the flange portion 102. The plurality of openings 105 is arranged around a central axis 10c of the inner cylindrical body 10. Through these openings 105, a cooling medium is caused to flow into the inner cylindrical body 10 from the outside of the contact-type power supply apparatus 1. Note that the inner cylindrical body 10 is fixed to the conductive housing 51 having a block shape, and does not rotate in the contact-type power supply apparatus 1. Note that the direction in which the central axis 10c extends coincides with the Y-axis direction.

The outer cylindrical body 20 surrounds the cylindrical body portion 101 of the inner cylindrical body 10. The outer cylindrical body 20 is a conductive cylindrical body. The outer cylindrical body 20 is disposed concentrically to the inner cylindrical body 10. That is, the central axis of the outer cylindrical body 20 coincides with the central axis 10c of the inner cylindrical body 10. The outer cylindrical body 20 includes a cylindrical body portion 201 disposed on the flange portion 102 side, and a cylindrical body portion 202 having a smaller inner diameter than the cylindrical body portion 201. Each of the cylindrical body portions 201 and 202 has an annular shape in the cut surface of the X-Z axis plane. Further, the cylindrical body portion 101 protrudes from both ends of the outer cylindrical body 20 in the Y-axis direction.

The outer cylindrical body 20 is configured to be rotatable around the central axis 10c. For example, a contact surface 205 is provided on the outer peripheral surface of the cylindrical body portion 201. A loop-shaped belt 21 is in contactable with the contact surface 205. The belt 21 is erected on the contact surface 205 so as to surround the outer cylindrical body 20. When the belt 21 rotates around the outer cylindrical body 20 by a drive system such as a motor, the outer cylindrical body 20 rotates around the central axis 10c. As a result, the outer cylindrical body 20 rotates around the inner cylindrical body 10.

The annular body 301 surrounds the cylindrical body portion 101 of the inner cylindrical body 10. The annular body 301 faces the inner cylindrical body 10 in the Z-X axis plane. The annular body 301 is disposed concentrically to the inner cylindrical body 10 and the outer cylindrical body 20. The annular body 301 is fixed to the housing 51. The annular body 301 is configured so as not to be in contact with the outer cylindrical body 20. The annular body 301 has conductivity. Since the inner cylindrical body 10 is fixed to the housing 51, the annular body 301 is electrically connected to the inner cylindrical body 10.

A part of the annular body 301 is inserted into the cylindrical body portion 201 of the outer cylindrical body 20. That is, a part of the annular body 301 is located between the inner cylindrical body 10 and the outer cylindrical body 20. A part of the annular body 301 is surrounded by the cylindrical body portion 201 of the outer cylindrical body 20.

The contact unit 40 includes a contact body 401, a guide pin 402, a support 403, and an elastic member 404. The contact unit 40 faces the inner cylindrical body 10 in the Z-X axis plane. As a single component, the contact unit 40 is attachable/detachable to/from the contact-type power supply apparatus 1.

The contact body 401 surrounds the cylindrical body portion 101 of the inner cylindrical body 10. The contact body 401 is disposed concentrically to the inner cylindrical body 10 and the outer cylindrical body 20. The contact body 401 is located between the cylindrical body portion 101 of the inner cylindrical body 10 and the cylindrical body portion 201 of the outer cylindrical body 20. Further, the contact body 401 is surrounded by the cylindrical body portion 201 of the outer cylindrical body 20. The contact body 401 has conductivity. The contact body 401 is configured so as not to be in contact with the inner cylindrical body 10.

The contact body 401 faces the annular body 301 in the Y-axis direction. The guide pin 402 is fixed to the contact body 401, and the contact body 401 is supported by the support 403 via the guide pin 402. When the support 403 rotates with the outer cylindrical body 20 around the central axis 10c, the contact body 401 rotates around the central axis 10c. That is, the contact body 401 rotates around the inner cylindrical body 10 together with the outer cylindrical body 20.

The contact body 401 is capable of changing the relative distance to the support 403 by elastic deformation of the elastic member 404 such as a spring. For example, when the contact body 401 is separated from the support 403 and in contact with the annular body 301, a state in which the contact body 401 and the annular body 301 are brought into contact with each other is formed. When the contact body 401 rotates in this state, the contact body 401 slides with respect to the annular body 301.

Therefore, even if the contact body 401 rotates, the contact body 401 is capable of receiving the electric potential of the annular body 301 because the contact body 401 slides with respect to the annular body 301. That is, the electric potential of the annular body 301 is conducted to the contact body 401 during the rotation of the contact body 401. In other words, when the contact body 401 slides with the annular body 301, the inner cylindrical body 10 and the outer cylindrical body 20 are electrically connected to each other.

Note that in the contact-type power supply apparatus 1, an insulating member (not shown) is disposed as appropriate, and the outer cylindrical body 20 is insulated from the inner cylindrical body 10 when the contact body 401 is not in contact with the annular body 301.

The support 403 is an annular body, and is fixed to the cylindrical body portion 202 of the outer cylindrical body 20. The support 403 surrounds the cylindrical body portion 101 of the inner cylindrical body 10. The support 403 is disposed concentrically to the inner cylindrical body 10 and the outer cylindrical body 20. The support 403 is located between the cylindrical body portion 101 of the inner cylindrical body 10 and the cylindrical body portion 201 of the outer cylindrical body 20. Further, the support 403 is surrounded by the cylindrical body portion 201 of the outer cylindrical body 20. The support 403 rotates around the central axis 10c together with the outer cylindrical body 20 and the contact body 401.

The guide pin 402 is inserted into the support 403. The support 403 supports the contact body 401 via the guide pin 402. The relative distance between the support 403 and the contact body 401 in the Y-axis direction is variable by the elastic deformation of the elastic member 404.

In the contact-type power supply apparatus 1, the inner cylindrical body 10 is not in contact with the outer cylindrical body 20, the contact unit 40 is not in contact with the inner cylindrical body 10, and the annular body 301 is not in contact with the inner cylindrical body 10. As a result, a space is formed between the inner cylindrical body 10 and the outer cylindrical body 20. This space is applied to, for example, a return path 112 through which a liquid medium flows. Note that the liquid medium functions as a cooling liquid as well as a lubricant liquid for lubricating the sliding between the contact body 401 and the annular body 301. For example, as the liquid medium, water to which an inhibitor (a rust inhibitor, a corrosion inhibitor, or the like) is added may be used in order to inhibit corrosion due to the supply of the sputtering potential.

The housing 52 is connected to the housing 51 in the Y-axis direction. The housing 52 is a block body. A plurality of bearing members 60 is disposed between the outer cylindrical body 20 and the housing 52. Through the plurality of bearing members 60, the outer cylindrical body 20 is rotatably supported by the housings 51 and 52. The oil seal 61 is disposed on both sides of the bearing member 60 in the Y-axis direction. A plurality of oil seals 61 is interposed, for example, between the outer cylindrical body 20 and the housing 51, and between the outer cylindrical body 20 and the housing 52.

A forward path 511 and a return path 512 through which the liquid medium flows are provided in the housing 51. The forward path 511 communicates with a space in the inner cylindrical body 10 through the opening 105 of the inner cylindrical body 10. The space in the inner cylindrical body 10 is applied to a forward path 111 through which the liquid medium flows. Further, the return path 512 communicates with the return path 112.

The conductive cooling tube 53 is connected to the housing 51 in the Z-axis direction. The cooling tube 53 is inserted into a support base 71 in the Z-axis direction. A forward path 531 and a return path 532 through which the liquid medium flows are provided in the cooling tube 53. The forward path 531 communicates with the forward path 511 of the housing 51, and the return path 532 communicates with the return path 112 via the return path 512.

Electric power from a sputter power source (not shown) is supplied to the cooling tube 53. As a result, the electric power supplied from the sputtering power source is conducted to the annular body 301 through the cooling tube 53 and the housing 51.

The housing case 70 houses the inner cylindrical body 10, the outer cylindrical body 20, the annular body 301, the contact unit 40, the housings 51 and 52, the bearing member 60, and the oil seal 61. The housing case 70 functions also as a shielding plate to inhibit the high frequency supplied to the contact-type power supply apparatus 1 from leaking to the outside of the housing case 70. Further, the housings 51 and 52 are supported by the support base 71.

Outside the housing case 70, the disc-shaped flange 80 and the guide plate 81 having a smaller diameter than the flange 80 are disposed. The flange 80 is electrically conductive, and attached to the end of the outer cylindrical body 20. The inner cylindrical body 10 penetrates through the flange 80. The guide plate 81 is attached to the end of the inner cylindrical body 10. A gap is formed between the flange 80 and the guide plate 81, and this gap is applied to a return path 812 through which the liquid medium flows.

In the contact-type power supply apparatus 1, the respective members are joined to each other by fixing members such as bolts (not shown), fitting, or welding. Further, the shielding of the liquid and the gas between the respective members is performed by a sealing member such as an O-ring (not shown).

In the contact-type power supply apparatus 1, the materials of the annular body 301 and the contact body 401 are different from each other in order to suppress cutting chips generated by sliding between the annular body 301 and the contact body 401 and adhesion between the annular body 301 and the contact body 401.

As an example, the annular body 301 is formed of, for example, stainless steel (SUS), pure copper (Cu), or brass (CuZn). The contact body 401 is formed of, for example, phosphor bronze (CuSn). By making the hardness of the contact body 401 smaller than that of the annular body 301, the contact body 401 is preferentially worn as compared with the annular body 301. However, the materials of the annular body 301 and the contact body 401 may be replaced with each other. The same effect can be achieved even with such a configuration. Other conductive members are formed of, for example, aluminum (Al), stainless steel (SUS), pure copper (Cu), or iron (Fe). For example, it has been found that, when the annular body 301 is formed of stainless steel, the contact body 401 is formed of phosphor bronze, and the outer cylindrical body 20 is formed of stainless steel as a combination of the materials, uneven wear in the respective contact surfaces is small. In addition, the flow of the liquid medium removes (washes) wear powder from the respective contact surfaces and improves the lubricating effect on the respective contact surfaces.

Next, a rotary target mechanism 15 attached to the contact-type power supply apparatus 1 will be described. Note that in FIG. 1, a partial configuration of the rotary target mechanism 15 is omitted. The rotary target mechanism 15 is used as, for example, a target mechanism in the sputtering apparatus.

The rotary target mechanism 15 includes a cylindrical target member 151, a cylindrical backing tube 152, a cylindrical inner tube 153, a cylindrical outer tube 154, and a disc-shaped spacer 155. A return path 156 through which a liquid medium flows is formed in the spacer 155.

The target member 151 is supported on the outer periphery of the backing tube 152. The target member 151 is electrically connected to the backing tube 152. The backing tube 152 is supported by the outer tube 154 and is attached to the flange 80. The backing tube 152 is electrically connected to the flange 80.

The inner tube 153 is disposed in the outer tube 154 via the spacer 155. The inner tube 153 is disposed concentrically to the central axis 10c and is connected to the cylindrical body portion 101 of the inner cylindrical body 10. A magnet unit for performing magnetron sputtering may be disposed between the inner tube 153 and the outer tube 154.

When the belt 21 rotates by the drive system, the outer cylindrical body 20 rotates in accordance with this rotation. As a result, the flange 80 rotates, and the rotary target mechanism 15 attached to the flange 80 rotates.

When the outer cylindrical body 20 is electrically connected to the annular body 301 via the contact unit 40 while the rotary target mechanism 15 is rotating, electric power from the outside is conducted to the outer cylindrical body 20 via the annular body 301. This electric power is conducted through the flange 80 to the backing tube 152 and further to the target member 151. As a result, plasma is formed in the vicinity of the surface of the target member 151, and the sputtering particles from the target member 151 fly toward a substrate (not shown).

Further, in the contact-type power supply apparatus 1, a liquid medium flows through the forward paths 531, 511, and 111, and the liquid medium is introduced to the inner tube 153 of the rotary target mechanism 15. Further, the liquid medium returned to the outer tube 154 of the rotary target mechanism 15 flows through the return paths 812, 112, 512, and 532 via the return path 156. As a result, heat exchange occurs between the target member 151 and the liquid medium, and the target member 151 is cooled during sputtering.

In particular, in the contact-type power supply apparatus 1, a brush is not provided between the inner cylindrical body 10 and the outer cylindrical body 20. Therefore, in the contact-type power supply apparatus 1, the liquid medium flows without passing through the brush. As a result, in the contact-type power supply apparatus 1, the fluidity that the liquid medium flows is greatly improved. That is, in the contact-type power supply apparatus 1, the cooling efficiency of the rotary target mechanism 15 is increased. Further, the flow path of the liquid medium may be provided with a filter mechanism for removing the wear powder generated by the contact between the contact body 401 and the annular body 301.

Figure 2:
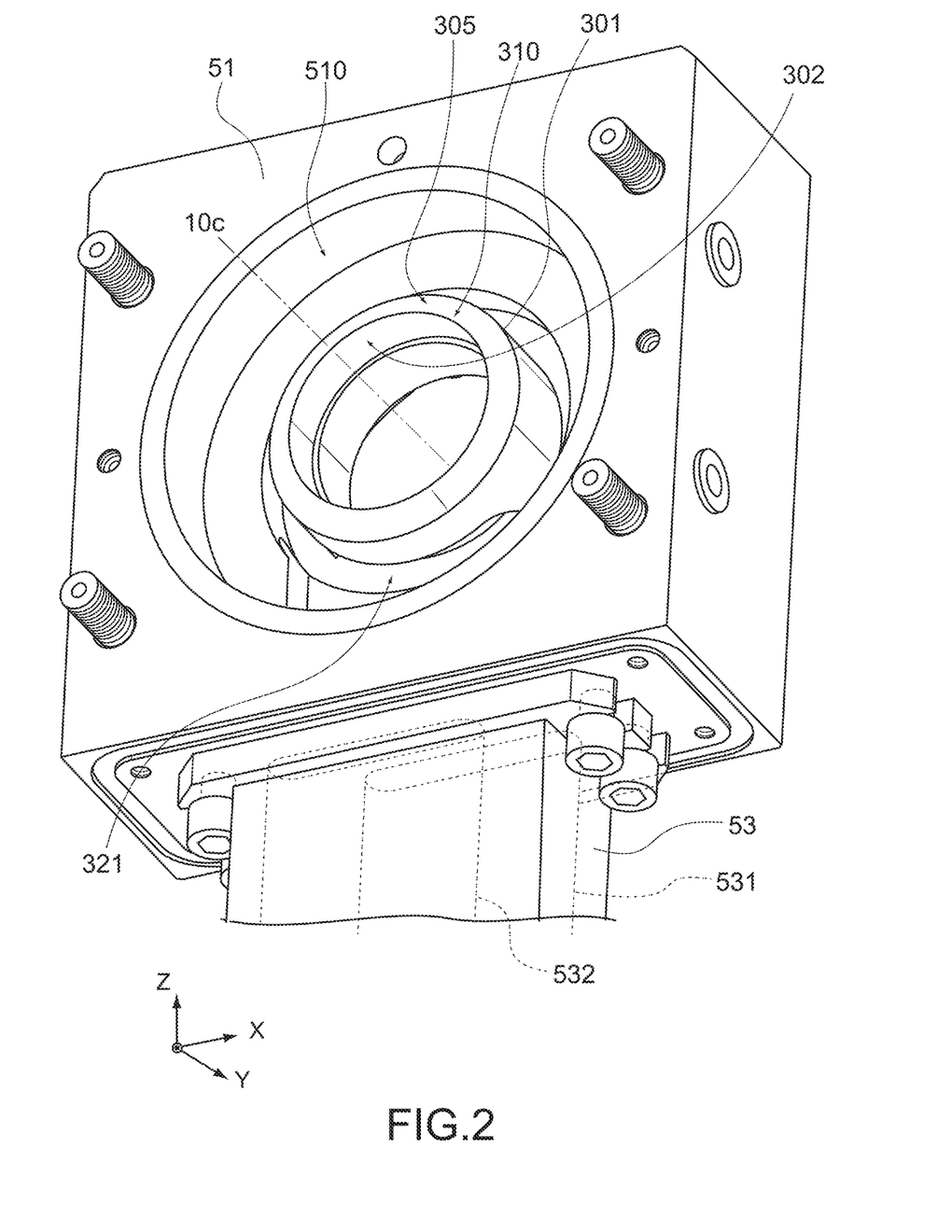
FIG. 2 is a schematic perspective view showing an annular body and members around the annular body.

FIG. 2 is a schematic perspective view showing an annular body and members around the annular body.

The annular body 301 is fixed to the housing 51. The annular body 301 is housed in a recessed portion 510 provided in the housing 51. The central axis of the recessed portion 510 coincides with the central axis 10c. An opening 321 leading to the return path 532 of the cooling tube 53 is provided in a lower portion of the annular body 301.

The annular body 301 has a contact surface 305 that can be brought into contact with the contact body 401. The contact surface 305 is an end surface of the annular body 301 and intersects the central axis 10c. For example, in the annular body 301, the inner wall surface 302 of the annular body 301 and the contact surface 305 form a tip portion 310 having a tip angle smaller than 90 degrees. The contact surface 305 has a tapered inclined surface descending from the tip portion 310 toward the outside from the central axis of the annular body 301.

By forming the contact surface 305 to have a tapered shape, the contact area of the contact surface 305 increases as compared with the cut surface in the case of cutting the annular body 301 in parallel with the Z-X axis plane. Further, the pressing force per unit area received by the contact surface 305 upon contact with the contact body 401 from the contact body 401 is reduced as compared with the cut surface when cutting the annular body 301 in parallel with the Z-X axis plane. As a result, even if the contact body 401 slides on the contact surface 305, the contact surface 305 is less likely to wear.

Figure 3:
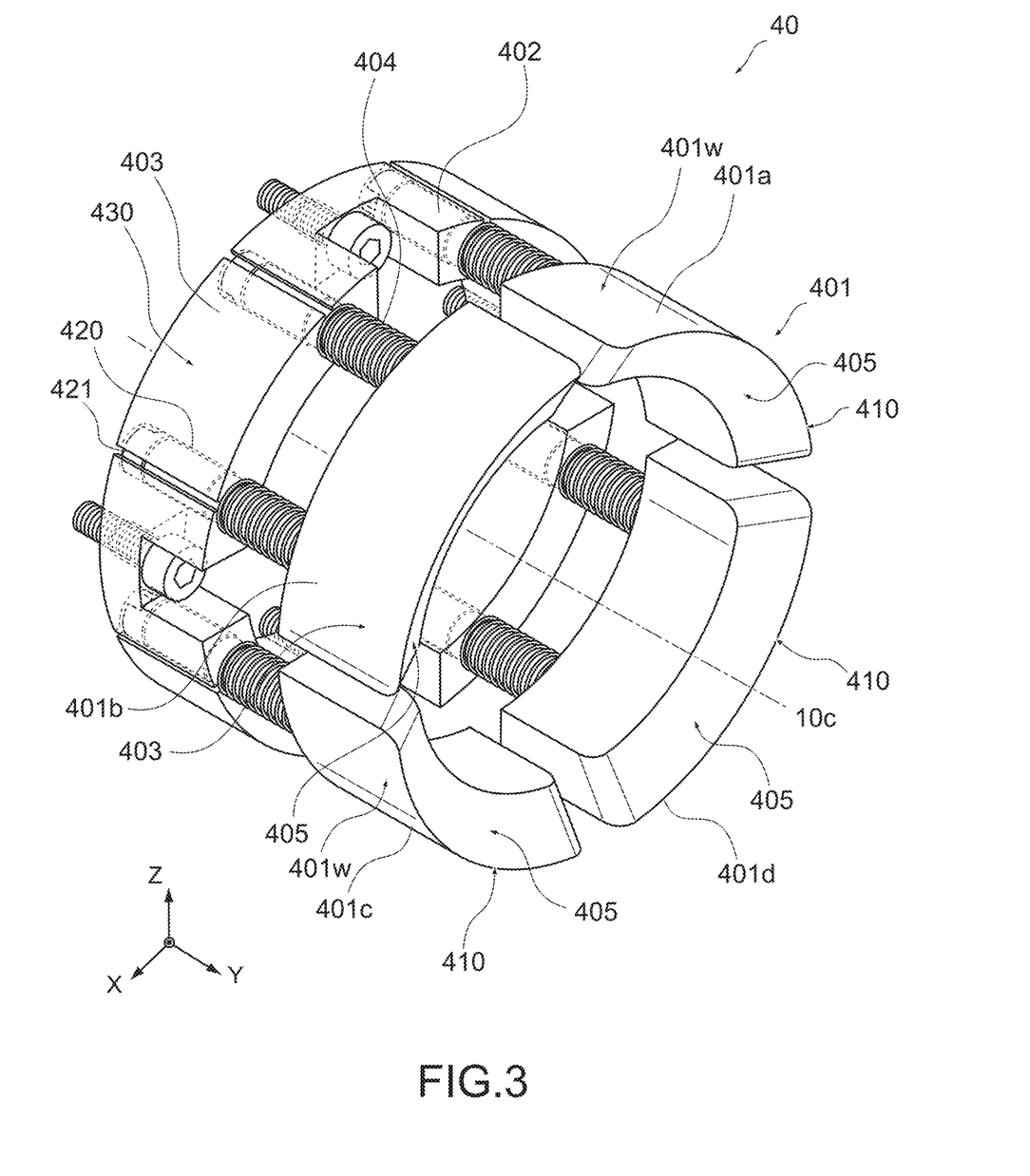
FIG. 3 is a schematic perspective view showing a contact unit.

FIG. 3 is a schematic perspective view showing a contact unit.

In the contact unit 40, the contact body 401 is divided into at least two parts in the direction in which the outer cylindrical body 20 rotates. For example, in FIG. 3, the contact body 401 is divided into four parts around the central axis 10c. The number of divisions is not limited to this example. Contact body portions 401a to 401d are arranged point symmetrically around the central axis 10c. When the contact unit 40 is viewed from the Y-axis direction, each of the contact body portions 401a to 401d has an arc shape. Further, the curvature of an outer peripheral surface 401w of each of the contact body portions 401a, 401b, 401c, and 401d is, for example, the same as the curvature of the inner peripheral surface of the cylindrical body portion 201. As a result, the outer peripheral surface 401w of each of the contact body portions 401a, 401b, 401c, and 401d is surely brought into contact with the inner peripheral surface of the cylindrical body portion 201.

The contact body 401 has a contact surface 405 intersecting the Y-axis direction. The contact surface 405 is a surface facing the contact surface 305 when the contact body 401 is separated from the annular body 301, and is a surface that is in contact with the contact surface (inclined surface) 305 when the contact body 401 is in contact with the annular body 301.

The contact surface 405 has a tapered shape descending from the tip portion 410 toward the central axis from the outside of the contact body 401. Here, the tip portion 410 is formed by an outer wall surface 430 of the contact body 401 and the contact surface 405, and has the tip angle smaller than 90 degrees. The inclination angle of the contact surface 405 is adjusted so that the entire surface of the contact surface 405 is in contactable with the contact surface 305. By forming such a contact surface 405 on the contact body 401, the contact area with the annular body 301 increases, and the contact surface 405 is hardly worn.

The relative distance of each of the contact body portions 401a to 401d to the support 403 varies independently. For example, each of the contact body portions 401a to 401d includes the guide pin 402 protruding toward the support 403. For example, in FIG. 3, two guide pins 402 are disposed in each of the contact body portions 401a to 401d. The guide pin 402 is fixed to the contact body 401 from the side opposite to the annular body 301 by screwing, welding, driving, or the like.

The support 403 is provided with an opening 420 for inserting the guide pin 402. The opening 420 extends in the axial direction of the guide pin 402. The guide pin 402 protruding from the contact body 401 is inserted into the opening 420 of the support 403 and is supported by the support 403. Further, the support 403 is provided with a slit 421 communicating with the opening 420. The slit 421 extends in the axial direction of the guide pin 402. As a result, a part of the opening 420 is opened from the outer wall surface 430 of the support 403.

By providing such a slit 421, the guide pin 402 is not excessively tightened by the opening 420. As a result, the guide pin 402 smoothly slides with respect to the support 403.

Further, by fixing the plurality of guide pins 402 to the respective contact body portions 401a to 401d, rotation of the guide pin 402 supported by the support 403, in other words, rotation of the contact body portions 401a to 401d around the guide pin 402 is inhibited.

The elastic member 404 such as a coil spring is disposed around the guide pin 402. The elastic member 404 is disposed along the guide pin 402. The inner diameter of the elastic member 404 is wider than the inner diameter of the opening 420. As a result, one end of the elastic member 404 is locked by the annular body 301, and the other end of the elastic member 404 is locked by the support 403. Therefore, a repulsive force acts between the contact body 401 and the support 403 when the elastic member 404 is in a state of being shorter than the freedom length of the elastic member 404, and an attractive force acts between the contact body 401 and the support 403 when the elastic member 404 is in a state of being longer than the free length of the elastic member 404.

In the contact-type power supply apparatus 1, the thickness in the Y-axis direction of the contact body 401, the length of the guide pin 402, the elastic member 404, and the like are adjusted so that the contact body 401 is constantly in contact with the annular body 301 even if the contact body 401 is worn. As a result, even if the contact surface 405 is worn, the contact surface 405 is constantly in contact with the annular body 301 by the repulsive force of the elastic member 404.

In the contact-type power supply apparatus 1, the following advantages are achieved by providing a mechanism in which each of the contact body portions 401a to 401d is independently separated from the support 403 or approaches the support 403.

For example, in the case where the contact body 401 is formed in an integral annular shape instead of a divided structure, the contact surface 405 comes into contact with the contact surface 305 in a dotted or linear shape in some cases if the axial center of the contact body 401 and the axial center of the annular body 30 are deviated from each other. This is because in the case where the contact body 401 is integrally formed, the distance between the contact body 401 and the support 403 is the same anywhere. In this case, if the contact body 401 is an elastic body, the pressing force by the elastic member 404 elastically deforms the contact body 401, and the contact surface 405 may be evenly in contact with the contact surface 305. However, since the contact body 401 is formed of metal and is a rigid body, such elastic deformation does not easily occur.

Meanwhile, in the contact-type power supply apparatus 1, each of the contact body portions 401a to 401d moves independently. That is, the distance between each of the contact body portions 401a to 401d and the support 403 is independently changed. Therefore, the contact surface 405 of each of the contact body portions 401a to 401d is evenly in contact with the annular body 301.

Further, the contact surface 305 has a tapered shape descending from the tip portion 310 toward the outside from the central axis 10c. Meanwhile, the contact surface 405 has a tapered shape descending from the tip portion 410 toward the central axis 10c from the outside of the contact body 401. Therefore, when the contact body 401 is in contact with the annular body 301 by the spring force of the elastic member 404 in the central axis direction, a displacement occurs between the contact surface 305 and the contact surface 405. Therefore, the contact body 401 receives a force in a direction perpendicular to the axial center direction of the spring force, i.e., in a direction in which the contact body 401 is away from the inner cylindrical body 10. As a result, the contact body 401 is pressed against the inner peripheral surface of the cylindrical body portion 201 of the outer cylindrical body 20.

As a result, when the contact body 401 slides and rotates on the annular body 301, the contact body 401 comes into contact with the cylindrical body portion 201 of the outer cylindrical body 20, and the contact body 401 is surely fixed to the cylindrical body portion 201 of the outer cylindrical body 20 by the frictional force between the contact body 401 and the outer cylindrical body 20. As a result, the electric power supplied to the annular body 301 is finally conducted to the target member 151 via the annular body 301, the contact body 401, and the cylindrical body portion 201. Note that during the sliding rotation of the outer cylindrical body 20, the inner cylindrical body 10 and the contact body 401 are surely brought into a non-contact state, and the contact body 401 is inhibited from being worn on a surface other than the contact surface 405.

Here, in the opening 420, a gap is provided between the guide pin 402 and the support 403 so that the contact body 401 shifts to the inner peripheral surface of the outer cylindrical body 20. By providing such a gap, each of the contact body portions 401a to 401d has a three-dimensional degree of freedom including the Y-axis direction. As a result, each of the contact body portions 401a to 401d easily comes into contact with the annular body 301, and the outer peripheral surface 410w of each of the contact body portions 401a to 401d easily comes into contact with the inner peripheral surface of the cylindrical body portion 201.

As described above, in the contact-type power supply apparatus 1, the contact body 401 is configured to be pressed against the outer cylindrical body 20 when the contact body 401 is pressed against the contact surface 305 (inclined surface) of the annular body 301. In accordance with such a contact-type power supply apparatus 1, it is possible to cause a current to flow stably between the cylindrical bodies for a long time with a simple structure using no brush. In particular, in the contact-type power supply apparatus 1, the sliding surface relating to the current flow between the inner cylindrical body 10 and the outer cylindrical body 20 is one surface, and the structure becomes simpler.

MODIFIED EXAMPLE 1

Figure 4:
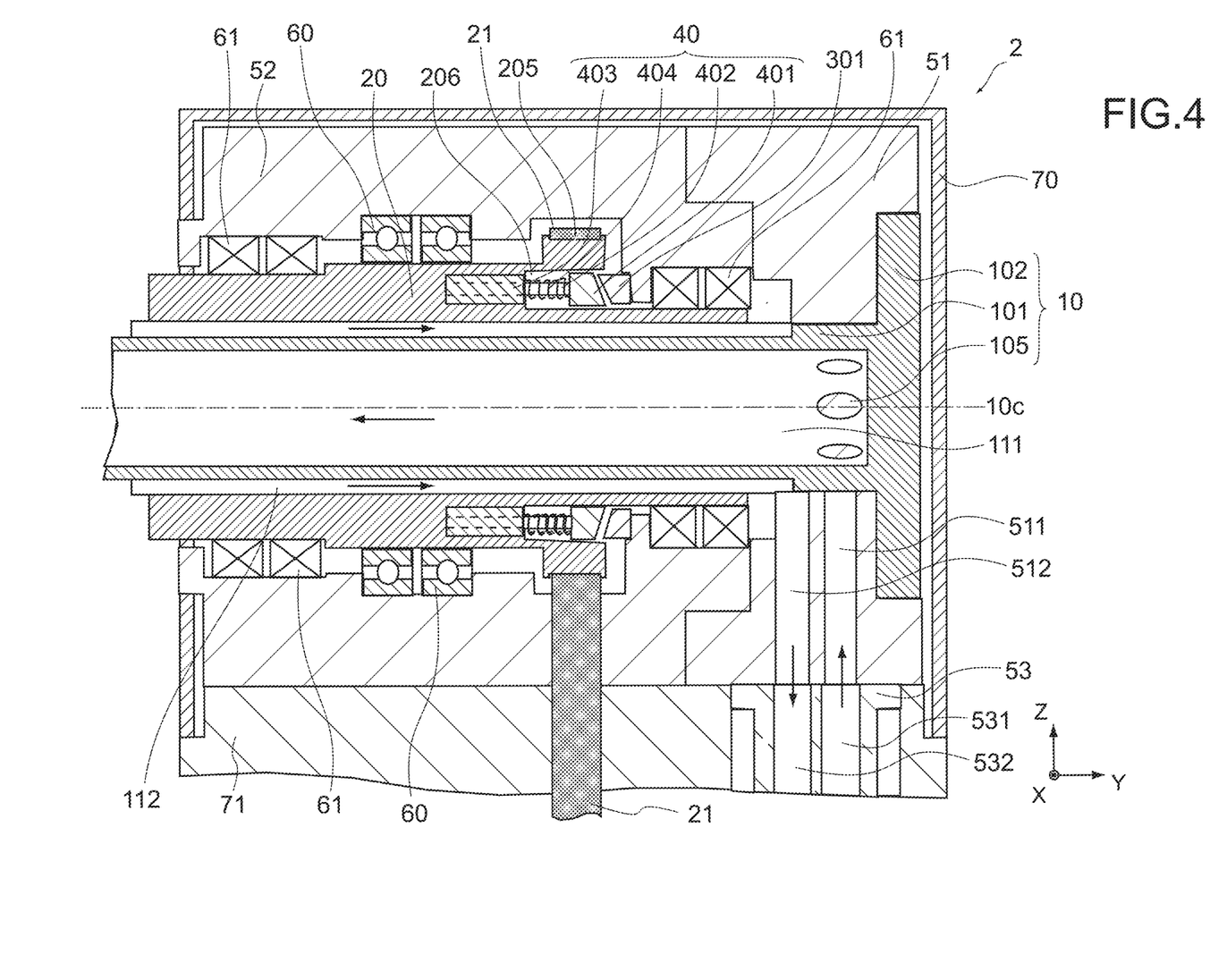
FIG. 4 is a schematic cross-sectional view showing a modified example of the contact-type power supply apparatus according to this embodiment.

FIG. 4 is a schematic cross-sectional view showing a modified example of the contact-type power supply apparatus according to this embodiment. In FIG. 4, the flange 80, the guide plate 81, and the like are not shown.

In the contact-type power supply apparatus 2, the outer cylindrical body 20 is surrounded by the annular body 301. The contact body 401 faces the annular body 301 in the Y-axis direction. An annular groove portion 206 extending in the Y-axis direction is formed in the outer cylindrical body 20 from the flange portion 102 side. The contact unit 40 is installed in the groove portion 206.

The annular body 301 and the contact unit 40 face the inner cylindrical body 10 via the outer cylindrical body 20. The contact unit 40 is in contact with the outer cylindrical body 20. As a result, the contact body 401 is electrically connected to the outer cylindrical body 20. The annular body 301 is fixed to the housing 52. The housing 52 is in contact with the housing 51. As a result, the annular body 301 is electrically connected to the housing 51.

Also in such a structure, the contact body 401 is capable of receiving the electric potential of the annular body 301 when the contact body 401 slides with respect to the annular body 301.

MODIFIED EXAMPLE 2

Figure 5:
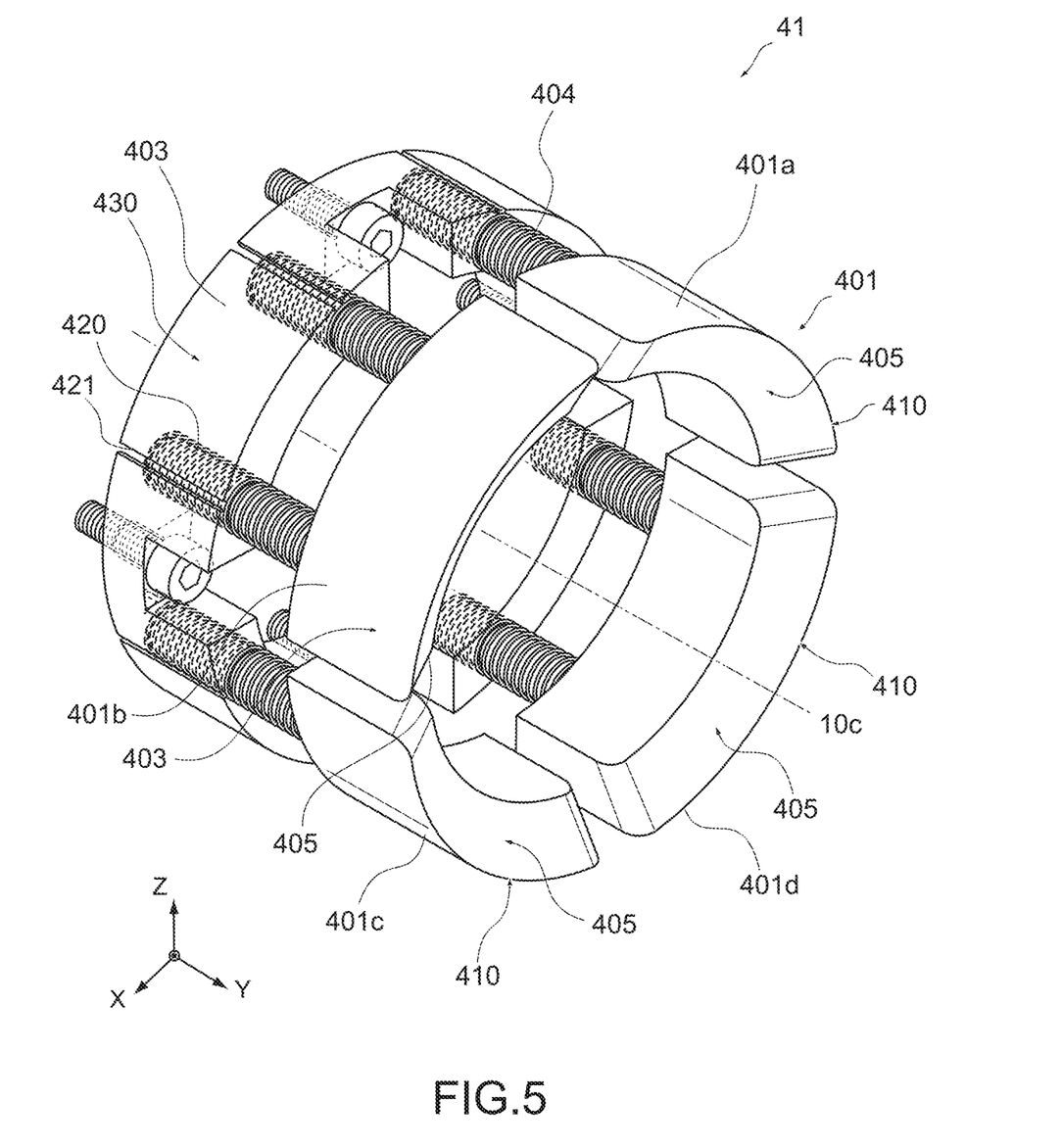
FIG. 5 is a schematic cross-sectional view showing another modified example of the contact-type power supply apparatus according to this embodiment.

FIG. 5 is a schematic cross-sectional view showing another modified example of the contact-type power supply apparatus according to this embodiment. In FIG. 5, a contact unit 41 is illustrated. The contact unit 41 is attachable to the contact-type power feeding apparatuses 1 and 2.

In the contact unit 41, the guide pin 402 is not used, the elastic member 404 is inserted into the opening 420, and the elastic member 404 is locked at the end of the opening 420. Further, a recessed portion into which the elastic member 404 is inserted is formed in the contact body 401.

Even in such a structure, if the elastic member 404 has a predetermined mechanical strength, the elastic member 404 is not distorted even if the support 403 rotates. In addition, the contact unit 41 has a mechanism for moving the contact body 401 away from the support 403 or closer to the support 403 due to the presence of the elastic member 404.

Although an embodiment of the present invention has been described above, it goes without saying that the present invention is not limited to the above-mentioned embodiment and various modifications can be made. For example, it is desirable that the support 403 and the guide pin 402 be conductive members in the case where a preliminary electric path for electrically connecting the contact body 401 to the outer cylindrical body 20 through the guide pin 402 and the support 403 is formed. In addition, in the case where a preliminary electric path for supplying electricity from the contact body 401 to the support 403 via the elastic member 404 is formed, it is favorable that the elastic member 404 has conductivity. This further improves the electrical conductivity between the contact body 401 and the support 403. Further, each embodiment is not limited to an independent form, and can be combined as much as technologically possible.

What is claimed is:

1. A contact-type power supply apparatus, comprising:
   a first cylindrical body;
   a second cylindrical body configured to surround the first cylindrical body, to be disposed concentrically to the first cylindrical body, and to be rotatable around a central axis of the first cylindrical body;
   an annular body configured to surround the first cylindrical body, to be disposed concentrically to the first cylindrical body, to be in non-contact with the second cylindrical body, and to have an end surface being an inclined surface having a tapered shape; and
   a contact body configured to face the annular body in an axial direction of the first cylindrical body, to be electrically connected to the second cylindrical body, to rotate around the central axis around the first cylindrical body together with the second cylindrical body, to have a contact surface contactable with the inclined surface, and being capable of receiving an electric potential of the annular body by sliding with the annular body.

2. The contact-type power supply apparatus according to claim 1, wherein the contact body is configured to be pressed against the second cylindrical body when the contact body is pressed against the inclined surface of the annular body.

3. The contact-type power supply apparatus according to claim 1, further comprising
an annular support that is fixed to the second cylindrical body, surrounds the first cylindrical body, and support the contact body,
the support being configured to rotate around the central axis together with the second cylindrical body and the contact body,
a relative distance between the support and the contact body in the axial direction being variable.

4. The contact-type power supply apparatus according to claim 3, wherein
the contact body is divided into at least two parts in a direction, the second cylindrical body rotates in the direction, and
the relative distance of each of the at least two parts is independently variable.

5. The contact-type power supply apparatus according to claim 3, wherein
the contact body includes a guide pin that protrudes toward the support,
the guide pin is configured to be inserted into and supported by the support, and
the guide pin is configured to be slidable in the axial direction with respect to the support.

6. The contact-type power supply apparatus according to claim 5, wherein
an elastic member is disposed around the guide pin, and
the contact body is in contactable with the annular body by a repulsive force of the elastic member between the contact body and the support.

7. The contact-type power supply apparatus according to claim 5, wherein
a gap is provided between the guide pin and the support.

8. The contact-type power supply apparatus according to claim 5, wherein
the second cylindrical body is surrounded by the annular body, and
the contact body faces the annular body in a direction of the central axis.

9. A contact unit applied to a contact-type power supply apparatus including a first cylindrical body and a second cylindrical body configured to surround the first cylindrical body, to be disposed concentrically to the first cylindrical body, and to be rotatable around a central axis of the first cylindrical body, the contact unit comprising:
a contact body configured to face an annular body in an axial direction of the first cylindrical body, to surround the first cylindrical body, to be disposed concentrically to the first cylindrical body, to have a contact surface that is in contact with an inclined surface that is a tapered end surface of the annular body, and to being capable of receive an electric potential of the annular body by sliding with the annular body, and the annular body being configured to be in non-contact with the second cylindrical body; and
an annular support fixed to the second cylindrical body, being capable of surrounding the first cylindrical body, and supporting the contact body,
a relative distance between the support and the contact body in the axial direction being variable.

* * * * *